(12) United States Patent
Cherrette et al.

(10) Patent No.: US 6,434,501 B1
(45) Date of Patent: Aug. 13, 2002

(54) AUTOMATIC NETWORK ANALYZER HAVING NOISE/NPR TEST CAPABILITY

(75) Inventors: Alan Cherrette, Los Altos; Michael S. Davis, Mountain View; Levent Ersoy, Cupertino; Joel Varney, Mountain View, all of CA (US)

(73) Assignee: Space Systems/Loral, Inc., Palo Alto, CA (US)

( * ) Notice: Subject to any disclaimer, the term of this patent is extended or adjusted under 35 U.S.C. 154(b) by 0 days.

(21) Appl. No.: 09/532,670

(22) Filed: Mar. 21, 2000

(51) Int. Cl.[7] .............................................. G01R 23/00
(52) U.S. Cl. .................................... 702/120; 324/76.19
(58) Field of Search ........................... 702/120, 68, 67; 324/76.19, 613, 614, 620

(56) References Cited

U.S. PATENT DOCUMENTS

| | | | | |
|---|---|---|---|---|
| 4,694,258 A | * | 9/1987 | Blumenkranz et al. | 330/2 |
| 4,870,348 A | * | 9/1989 | Smith et al. | 324/77 B |
| 5,180,985 A | * | 1/1993 | Zoccarato et al. | 324/613 |
| 5,340,979 A | * | 8/1994 | Baney et al. | 250/214 B |
| 5,416,422 A | * | 5/1995 | Dildine | 324/614 |
| 5,778,015 A | * | 7/1998 | Gunning et al. | 372/25 |

OTHER PUBLICATIONS

Stjernman et al. Mar. 95—IEEE—"Dual–Channel and Multifrequency Radar System Calibration", p325–330.*

* cited by examiner

Primary Examiner—Marc S. Hoff
Assistant Examiner—Paul L. Kim
(74) Attorney, Agent, or Firm—Kenneth W. Float

(57) ABSTRACT

An automatic network analyzer that measures continuous wave radio microwave driven transfer characteristics of nonlinear devices and simultaneously calculates and displays corresponding noise driven transfer characteristics and noise power ratio data. This automatic network analyzer employs software or firmware that uses closed-form equations to exactly calculate noise parameters. This is done in real-time as CW measurements are taken.

4 Claims, 2 Drawing Sheets

AUTOMATIC NETWORK ANALYZER HAVING NOISE/NPR TEST CAPABILITY

BACKGROUND

The present invention relates generally to test equipment, and more particularly, to an automatic network analyzer that measures continuous wave radio frequency microwave driven transfer characteristics of nonlinear devices and simultaneously calculates and displays corresponding noise driven transfer characteristics and noise power ratio (NPR).

Previously, to obtain CW and noise transfer characteristics, including noise power ratio (NPR), two separate sets of test equipment were required, including one for CW measurements and a separate one for noise measurements. Equipment required for noise measurements includes power meters, spectrum analyzers and noise spectrum generating equipment. Simulation of noise parameters may be accomplished with the use of a separate communication software program on a separate computer.

In order to simplify the testing equipment, it would be advantageous to have an automatic network analyzer that includes both noise and noise power ratio measurement capability.

SUMMARY OF THE INVENTION

Tile present invention provides for a piece of test equipment comprising an automatic network analyzer that measures continuous wave (CW) radio frequency (RF) microwave driven transfer characteristics of nonlinear devices and simultaneously calculates and displays corresponding noise driven transfer characteristics and noise power ratio (NPR). The automatic network analyzer combines the functionality of a conventional automatic network analyzer with the ability to calculate noise parameters that otherwise would have to be measured using separate test equipment.

The automatic network analyzer employs software or firmware that uses closed form equations to exactly calculate noise parameters. This is done in real-time as CW measurements are taken. Integrating the ability to make these noise calculations and display results of the calculations simultaneously with the CW measurements allows hardware designers the ability to view results of adjustments to devices under test as they are made. This is done with one piece of integrated test equipment. No other known automatic network analyzer can view CW measurements and calculated noise data simultaneously.

The equations are preferably provided in firmware employed in the test equipment and use exact closed form equations to obtain predicted noise data. To obtain noise results using currently available test equipment, they must be either measured or simulated. Measurement normally requires separate equipment set-up. Simulation also normally requires separate equipment and software. Both of these testing endeavors can be expensive and time consuming. The present automatic network analyzer provides a user a way to see noise data in real time and allows for decreased test and troubleshoot time during design and production of nonlinear devices, for example.

BRIEF DESCRIPTION OF THE DRAWINGS

The various features and advantages of the present invention may be more readily understood with reference to the following detailed description taken in conjunction with the accompanying drawings, and wherein like reference numerals designate like structural elements, and in which.

DETAILED DESCRIPTION

Figure 1:
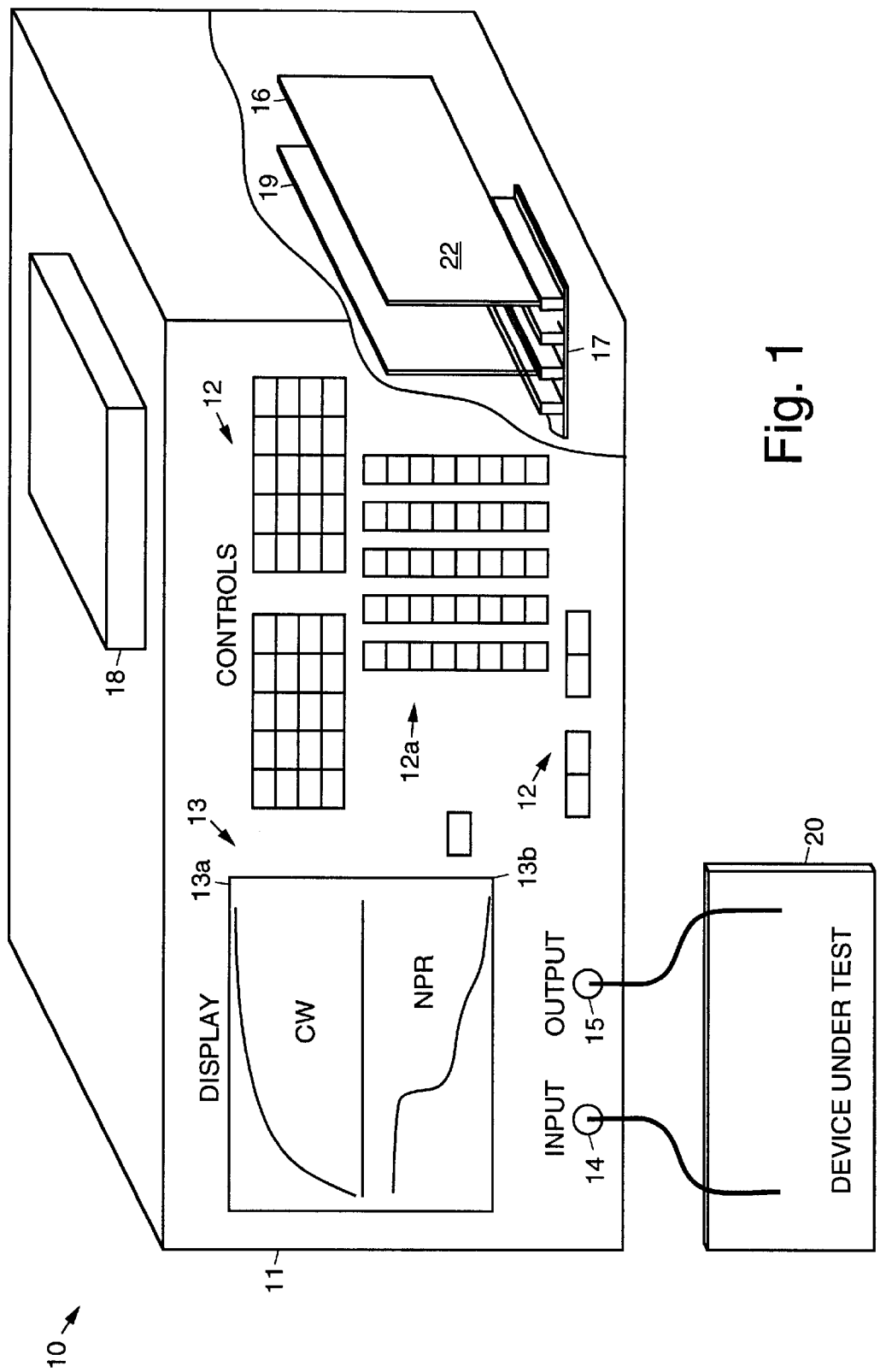
FIG. 1 illustrates an exemplary automatic network analyzer in accordance with the principles of the present invention.

Referring to the drawing figures, FIG. 1 is a block diagram that illustrates an exemplary automatic network analyzer 10 in accordance with the principles of the present invention. The automatic network analyzer 10 is used to test a device under test 20, such as a nonlinear device 20, for example. The automatic network analyzer 10 combines the functionality of a conventional automatic network analyzer with the ability to calculate noise parameters without requiring additional separate test equipment.

The exemplary automatic network analyzer 10 comprises a housing 11 having a plurality of control switches 12 and menus 12a, a dual display 13 comprising a CW data display 13a and a noise data display 13b, an RF/microwave input 14 and an RF/microwave output 15 on its front face. The exemplary automatic network analyzer 10 contains a computational processor card 16 that interfaces with an information or data bus 17 of the network analyzer 10. One or more disk drives 18 are provided that interface to the data bus 17 by way of a driver card 19.

The computational processor card 16 reads measured data as it is taken and calculates predicted noise data. The controls 12 and menus 12a allow a user to define what is calculated and what is displayed In particular, the controls 12 determine what (and how) parameters are measured for CW stimulus and what (and how) parameters are displayed for calculated noise data. These control parameters include the range of CW input power levels to be tested, the desired output to be displayed—Noise transfer, NPR, Noise phase or combination thereof. Menu choices will allow the user the ability to view the individual intermodulation products ($3^{rd}$, $5^{th}$, $7^{th}$, $9^{th}$, etc.) alone or on the same plot. These menus will be softkey menus similar to those used on standard microwave test equipment Typical automatic network analyzer functionality is present including the data bus interface, the one or more disk drives 18, and computer controllability, and the like. As with current standard test equipment the new invention will be able to act as a "slave" device that is controlled through software that is resident on another autonomous processor/computer. Designers could then use this single computer to control numerous pieces of test equipment simultaneously via a serial or parallel port connection. This feature is useful in a manufacturing environment where standard tests are repeated on each product.

The automatic network analyzer 10 measures continuous wave (CW) radio frequency (RF) microwave driven transfer characteristics of the device under test 20 (nonlinear device) and simultaneously calculates and displays corresponding noise driven transfer characteristics and noise power ratio. The improved automatic network analyzer 10 of the present invention thus has three enhancements compared to conventional automatic network analyzers. These include (1) the computational processor card 16 which reads measured data in real time and calculates predicted noise data, (2) the dual display 13 for displaying the resulting noise data, CW data or both, and (3) the controls 12 and menus 12a that allow the user to define what is calculated and what is displayed.

The automatic network analyzer 10 provides for a piece of test equipment that measures continuous wave (CW) radio frequency (RF) microwave driven transfer characteristics of nonlinear devices (the device under test 20) and simultaneously calculates and displays corresponding noise driven transfer characteristics as well as noise power ratio (NPR).

Software 22 or firmware 22 is contained in the computational processor card 16 that comprises closed-form equations to exactly calculate noise parameters. Computations are performed in real-time as CW measurements are taken. The closed-form equations used to compute the noise parameters are as follows.

Figure 2:
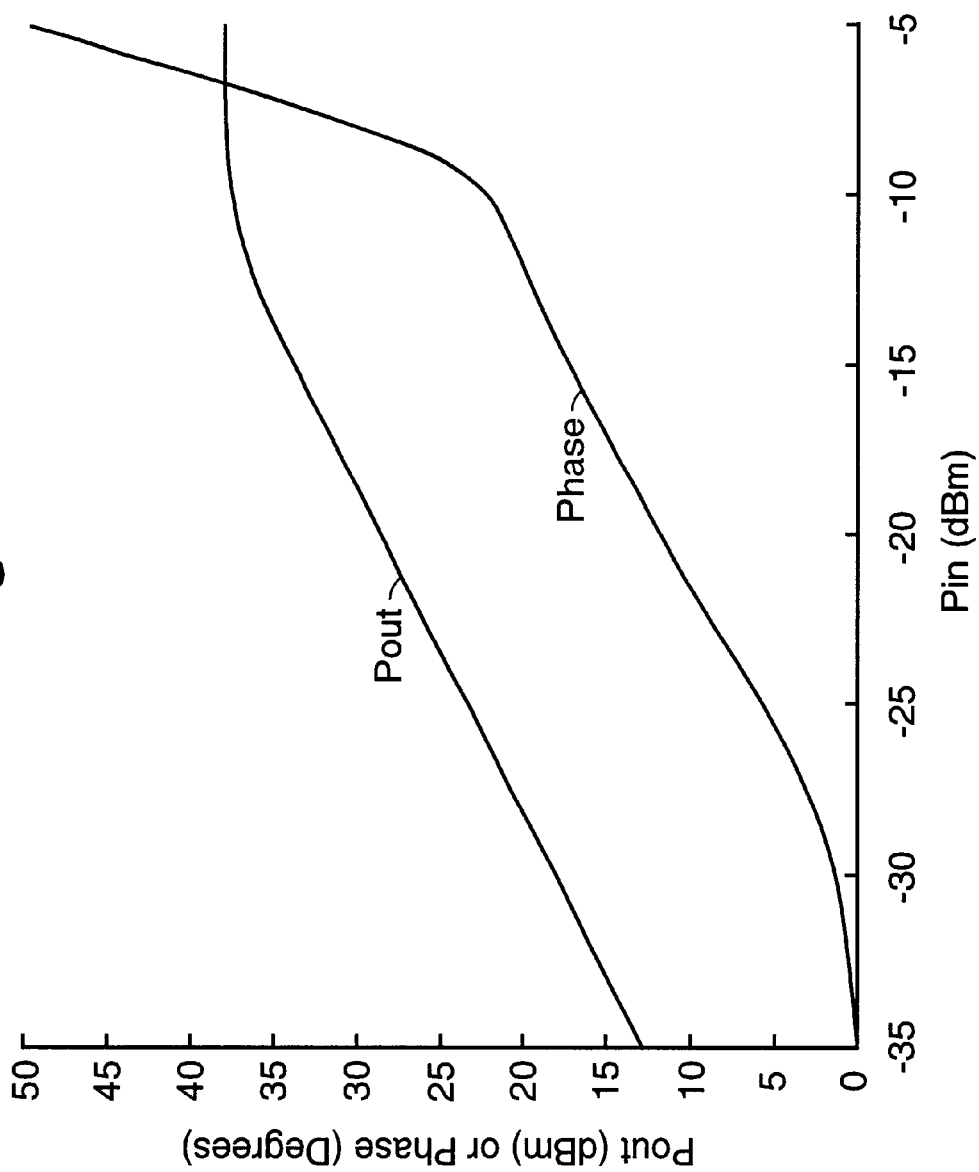
FIG. 2 illustrates an exemplary automatic network analyzer measured continuous wave output transfer characteristic for an amplifier.

FIG. 2 shows a plot of RF output power as a function of RF input power for a Continuous Wave (CW) sinusoidal signal applied to a Solid State Power Amplifier. Also shown is a plot of the phase of the RF output signal as a function of RF input power. The functional relationship of output power and output phase to input power can be written as $$A_{out} = W(P_{in}) \cdot \cos[\omega \cdot t + \theta(P_{in})] \quad (1)$$

or $$A_{out} = W(P_{in}) \cdot \cos[\theta(P_{in})] \cdot \cos[\omega \cdot t] + W(P_{in}) \cdot \sin[\theta(P_{in})] \cdot \sin[\omega \cdot t]$$
$$= U(P_{in}) \cdot \cos[\omega \cdot t] + V(P_{in}) \cdot \sin[\omega \cdot t]$$

where $A_{out}$ is the amplitude if the output signal. The power if the output signal is given by $$P_{out}(P_{in}) = \frac{1}{2} \cdot [U(P_{in})]^2 + \frac{1}{2} \cdot [V(P_{in})]^2 = \frac{1}{2} \cdot [W(P_{in})]^2 \quad \text{and}$$

$$\theta(P_{in}) = \arctan\left[\frac{V(P_{in})}{U(P_{in})}\right]$$

We can define in-phase and quadrature components of the output power functional relationship as follows:

$$P_{out}(P_{in}) = P_{out\_I}(P_{in}) + P_{out\_Q}(P_{in}) \quad (2)$$

where $$P_{out\_I}(P_{in}) = \frac{1}{2} \cdot [U(P_{in})]^2$$

$$P_{out\_Q}(P_{in}) = \frac{1}{2} \cdot [V(P_{in})]^2.$$

The quadrature components of power, $P_{out\_I}(P_{in})$ and $P_{out\_Q}(P_{in})$ can be calculated from the measured data shown in FIG. 2.

It can be shown by statistical arguments that the noise signal output power plus intermodulation product output power is given by $$P_{out\_noise} + IM(P_{in\_noise}) = \int_0^\infty P_{out\_I}(x) \cdot \left[\frac{1}{P_{in\_noise}} \cdot e^{\frac{-x}{P_{in\_noise}}}\right] dx + \quad (3)$$
$$\int_0^\infty P_{out\_Q}(x) \cdot \left[\frac{1}{P_{in\_noise}} \cdot e^{\frac{-x}{P_{in\_noise}}}\right] dx$$

It will further be shown that the noise signal output power without intermodulation product power is given by $$P_{out\_noise}(P_{in\_noise}) = \left[\int_0^\infty [P_{out\_I}(x)]^{1/2} \cdot \left[\left(\frac{x}{P_{in\_noise}}\right)^{1/2} \cdot \left(\frac{1}{P_{in\_noise}} \cdot e^{\frac{-x}{P_{in\_noise}}}\right)\right] dx\right]^2 + \quad (4)$$
$$\left[\int_0^\infty [P_{out\_Q}(x)]^{1/2} \cdot \left[\left(\frac{x}{P_{in\_noise}}\right)^{1/2} \cdot \left(\frac{1}{P_{in\_noise}} \cdot e^{\frac{-x}{P_{in\_noise}}}\right)\right] dx\right]^2 =$$
$$P_{out\_noise\_I}(P_{in\_noise}) + P_{out\_noise\_Q}(P_{in\_noise})$$

It can also can be shown that the third order intermodulation product output power is given by $$P_{out\_3IM}(P_{in\_noise}) = \quad (5)$$
$$\frac{1}{2}\left[\int_0^\infty [P_{out\_I}(x)]^{1/2} \cdot \left[\left(\frac{x}{P_{in\_noise}} - 2\right) \cdot \left(\frac{-x}{P_{in\_noise}}\right)^{1/2} \cdot \left(\frac{1}{P_{in\_noise}} \cdot e^{\frac{-x}{P_{in\_noise}}}\right)\right] dx\right]^2 +$$
$$\frac{1}{2}\left[\int_0^\infty [P_{out\_Q}(x)]^{1/2} \cdot \left[\left(\frac{x}{P_{in\_noise}} - 2\right) \cdot \left(\frac{x}{P_{in\_noise}}\right)^{1/2} \cdot \left(\frac{1}{P_{in\_noise}} \cdot e^{\frac{-x}{P_{in\_noise}}}\right)\right] dx\right]^2 =$$
$$P_{out\_3IM\_I}(P_{in\_noise}) + P_{out\_3IM\_Q}(P_{in\_noise})$$

and he fifth order intermodulation product output power is given by $$P_{out\_5IM}(P_{in\_noise}) = \frac{1}{12}\left[\int_0^\infty [P_{out\_I}(x)]^{1/2} \cdot \quad (6)\right.$$
$$\left.\left[\left(\frac{x^2}{P_{in\_noise}^2} - 6 \cdot \frac{x}{P_{in\_noise}} + 6\right) \cdot \left(\frac{x}{P_{in\_noise}}\right)^{1/2} \cdot \left(\frac{1}{P_{in\_noise}} \cdot e^{\frac{-x}{P_{in\_noise}}}\right)\right] dx\right]^2 +$$

-continued $$\frac{1}{12}\left[\int_0^\infty [P_{out\_Q}(x)]^{1/2}\cdot\right.$$

$$\left.\left[\left(\frac{x^2}{P_{in\_noise}^2}-6\cdot\frac{x}{P_{in\_noise}}+6\right)\cdot\left(\frac{x}{P_{in\_noise}}\right)^{1/2}\cdot\left(\frac{1}{P_{in\_noise}}\cdot e^{\frac{-x}{P_{in\_noise}}}\right)\right]dx\right]^2$$

Equations for the higher order intermodulation products are given by the derivative expression below.

$$P_{out\_QIM\_X}(P_{in\_noise})=\frac{P_{in\_noise}}{\left[\frac{Q+1}{2}\right]!\cdot\left[\frac{Q+1}{2}-1\right]!}\cdot \quad (7)$$

$$\left[P_{in\_noise}^{\left(\frac{Q-1}{2}\right)}\cdot\frac{\partial^{\left(\frac{Q-1}{2}\right)}}{\partial(P_{in\_noise})^{\left(\frac{Q-1}{2}\right)}}\left[\left(\frac{P_{out\_noise\_X}(P_{in\_noise})}{P_{in\_noise}}\right)^{1/2}\right]\right]^2$$

where Q is odd and represents the order of the intermodulation product power and X is either I or Q.

Equations (3), (4), (5) and (6) represent total noise power integrated over the band with no restriction n the power spectral density. Equations (5) and (6) are derived from equations (4) and (7) with Q equal to 3 and 5 respectively.

The automatic network analyzer 10 thus provides the ability to make noise calculations arid display results of the calculations simultaneously with the CW measurements This allows hardware designers the ability to view results of adjustments to devices under test 20 as they are made. The ability for a user to view CW measurements and calculated noise data simultaneously has not been done with any conventional automatic network analyzer.

Thus, an improved automatic network analyzer has been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. An automatic network analyzer for testing a device under test, comprising:

a housing;

a plurality of control switches and menus that allow a user to define what is calculated and what is displayed by the automatic network analyzer;

a dual display comprising a display for continuous wave (CW) data and a display for noise data;

an RF/microwave input;

an RF/microwave output;

a data bus;

one or more disk drives that interface to the data bus by way of a driver card; and a computational processor card that interfaces with the data bus and reads measured data derived from the device under test as it is taken and calculates predicted noise data of the device under test, which data are selectively displayed.

2. The automatic network analyzer recited in claim 1 wherein the device under test comprises a nonlinear device.

3. The automatic network analyzer recited in claim 1 wherein the measured data comprises continuous wave radio frequency microwave driven transfer characteristics of the device under test and wherein the predicted noise data comprises corresponding noise driven transfer characteristics and noise power ratio of the device under test.

4. The automatic network analyzer recited in claim 1 wherein the control switches determine what and how parameters are measured for CW stimulus and what and how parameters are displayed for calculated noise data.

* * * * *